United States Patent
Hara et al.

(10) Patent No.: US 11,923,714 B2
(45) Date of Patent: Mar. 5, 2024

(54) DEVICE AND METHOD FOR CONTROLLING A STORAGE BATTERY SYSTEM

(71) Applicant: Mitsubishi Electric Corporation, Tokyo (JP)

(72) Inventors: Satoshi Hara, Tokyo (JP); Tomoki Takegami, Tokyo (JP); Sadayuki Inoue, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 393 days.

(21) Appl. No.: 17/047,705

(22) PCT Filed: Feb. 22, 2019

(86) PCT No.: PCT/JP2019/006768
§ 371 (c)(1),
(2) Date: Oct. 15, 2020

(87) PCT Pub. No.: WO2019/239640
PCT Pub. Date: Dec. 19, 2019

(65) Prior Publication Data
US 2021/0152009 A1    May 20, 2021

(30) Foreign Application Priority Data
Jun. 11, 2018   (JP) ................... 2018-111108

(51) Int. Cl.
*H02J 7/00*     (2006.01)
*H01M 10/48*    (2006.01)
*H02J 7/02*     (2016.01)

(52) U.S. Cl.
CPC ....... *H02J 7/007182* (2020.01); *H01M 10/48* (2013.01); *H02J 7/0013* (2013.01); *H02J 7/0048* (2020.01); *H02J 7/02* (2013.01)

(58) Field of Classification Search
CPC .. H02J 7/0048; H02J 7/007182; H02J 7/0013; H02J 7/0014; H02J 7/0047;
(Continued)

(56) References Cited

U.S. PATENT DOCUMENTS 6,275,004 B1* 8/2001 Tamai ................. H01M 10/441
                                                     903/907
9,653,924 B2* 5/2017 Hiramura .............. H02J 7/0013
(Continued)

FOREIGN PATENT DOCUMENTS

| JP | 2010-148242 A | 7/2010 |
| JP | 2015-053817 A | 3/2015 |
| JP | 2017-112737 A | 6/2017 |

OTHER PUBLICATIONS

International Search Report and Written Opinion dated May 14, 2019 for PCT/JP2019/006768 filed on Feb. 22, 2019, 9 pages with English translation of International Search Report.

*Primary Examiner* — Richard Isla
*Assistant Examiner* — Sadia Kousar
(74) *Attorney, Agent, or Firm* — XSENSUS LLP

(57) ABSTRACT

A device for controlling a storage battery system is provided. The device includes: a state information calculator configured to calculate state information on each of batteries of a plurality of storage battery modules; a conversion efficiency characteristics calculator configured to calculate a power conversion efficiency of each of DC/DC converters of the plurality of storage battery modules; and a storage battery module selector configured to select one or a plurality of storage battery modules to be used while the storage battery system is charged or discharged and to determine a charge power or a discharge power of each of the selected storage battery modules, based on the state information of the batteries and the power conversion efficiencies of the DC/DC converters.

9 Claims, 9 Drawing Sheets

(58) Field of Classification Search
CPC ............ H02J 7/00047; H02J 7/00; H02J 7/02; H01M 10/48
See application file for complete search history.

(56) References Cited

U.S. PATENT DOCUMENTS

| | | | | |
|---|---|---|---|---|
| 9,776,526 | B2* | 10/2017 | Kakeno | H01M 8/04373 |
| 10,141,751 | B2* | 11/2018 | Arita | H02J 5/00 |
| 2013/0059220 | A1* | 3/2013 | Kim | H01M 8/04992 |
| | | | | 429/432 |
| 2017/0133865 | A1* | 5/2017 | Chiueh | H02J 7/0016 |
| 2018/0026546 | A1* | 1/2018 | Iisaka | H02M 3/28 |
| | | | | 320/140 |

* cited by examiner

DEVICE AND METHOD FOR CONTROLLING A STORAGE BATTERY SYSTEM

CROSS-REFERENCE TO RELATED APPLICATIONS

The present application is based on PCT filing PCT/JP2019/006768, filed Feb. 22, 2019, which claims priority to JP 2018-111108, filed Jun. 11, 2018, the entire contents of which are incorporated herein by reference.

TECHNICAL FIELD

The present invention relates to a device and method for controlling a storage battery system.

BACKGROUND ART

In recent years, from the viewpoint of a global environment preservation, using a renewable energy, such as solar power generation and wind power generation, etc. is rapidly expanded. However, the renewable energy has a defect in that electric power generation is easily affected by weather conditions, and thus stable supply of the renewable energy is difficult.

Currently, for the stable supply of the electric power generated through the renewable energy, a storage battery system is additionally installed to be operated. The storage battery system is used as a supplementary power supply when the generated electric power is low due to bad weather, or is used to suppress frequency fluctuation observed when the generated electric power sharply changes due to a sudden change in weather.

In a general storage battery system, a storage battery module is made of a battery and a DC/DC converter connected to the battery. The battery is made of a plurality of cells connected in series and in parallel. Further, a storage battery unit is made by connecting a plurality of storage battery modules in series. Finally, the storage battery system is made by optionally connecting a plurality of storage battery units in parallel.

As a related-art of the storage battery system, a technology has been proposed for the case when the storage battery system includes a storage battery module(s) having a different charge/discharge characteristics, in which the respective DC/DC converters of each storage battery module are controlled so that the voltages of the storage battery modules are to be equaled (see e.g. Patent Literature 1).

Moreover, a technology has been proposed, in which the number of times of switching of the DC/DC converters of the storage battery modules is reduced so that a power conversion loss is reduced (see e.g. Patent Literature 2).

CITATION LIST

Patent Literature

[PTL 1] JP 2010-148242 A
[PTL 2] JP 2015-53817 A

SUMMARY OF INVENTION

Technical Problem

However, in the related-art storage battery system, in the case when the storage battery system includes a storage battery module(s) having a different power conversion efficiency, in particular when a requested electric power is small, a power conversion efficiency of the storage battery system is decreased.

The present invention has been made to solve the above-mentioned problems, and has an object to provide a device and method for controlling a storage battery system which achieves a high power conversion efficiency even when the storage battery system includes a storage battery module(s) having a different power conversion efficiency.

Solution to Problem

In order to solve the above-mentioned problems, according to one embodiment of the present invention, a device for controlling a storage battery system is provided. The storage battery system has a plurality of storage battery modules connected in series and each of the storage battery modules including a battery and a DC/DC converter connected to the battery. The device comprises: a state information calculator configured to calculate state information on each of the batteries of the storage battery modules; a conversion efficiency characteristics calculator configured to calculate a power conversion efficiency of each of the DC/DC converters of the storage battery modules; and a storage battery module selector configured to select one or a plurality of storage battery modules to be used while the storage battery system is charged or discharged and to determine a charge power or a discharge power of each of the selected one or plurality of storage battery modules, based on the state information of the battery and the power conversion efficiencies of the DC/DC converters.

Further, according to another embodiment of the present invention, a device for controlling a storage battery system is provided. The storage battery system has a plurality of storage battery modules connected in series and each of the storage battery modules including a battery and a DC/DC converter connected to the battery. When the device selects and turns off any one of the storage battery modules and in that time if a power conversion efficiency of the storage battery system increases, the device stops the use of the selected battery module so as to select one or a plurality of storage battery modules to be used while the storage battery system is charged or discharged.

Further, according to one embodiment of the present invention, a method for controlling a storage battery system is provided. The storage battery system has a plurality of storage battery modules connected in series and each of the storage battery modules including a battery and a DC/DC converter connected to the battery. The method comprising the steps of: calculating state information on each of the batteries of the storage battery modules; calculating a power conversion efficiency of each of the DC/DC converters of the storage battery modules; and selecting one or a plurality of storage battery modules to be used while the storage battery system is charged or discharged and determining a charge power or a discharge power of each of the selected one or plurality of storage battery modules, based on the state information on the batteries and the power conversion efficiencies of the DC/DC converters.

Advantageous Effects of Invention

The device and method for controlling a storage battery system according to the present invention are configured to select a storage battery module(s) to be used, and to determine the charge/discharge power of the selected storage battery module(s), based on the state information on each of the batteries and the power conversion efficiency of each of the DC/DC converters of the plurality of the storage battery modules. With this configuration, even when the storage battery system includes a storage battery module(s) having a different power conversion efficiency, a high power conversion efficiency can be achieved.

DESCRIPTION OF EMBODIMENT

Now, details of a device and method for controlling a storage battery system according to an embodiment disclosed in the present application are described with reference to the accompanying drawings. It should be noted, however, that the embodiment described below is merely an example, and the present invention is not limited to this embodiment.

First Embodiment

Figure 1:
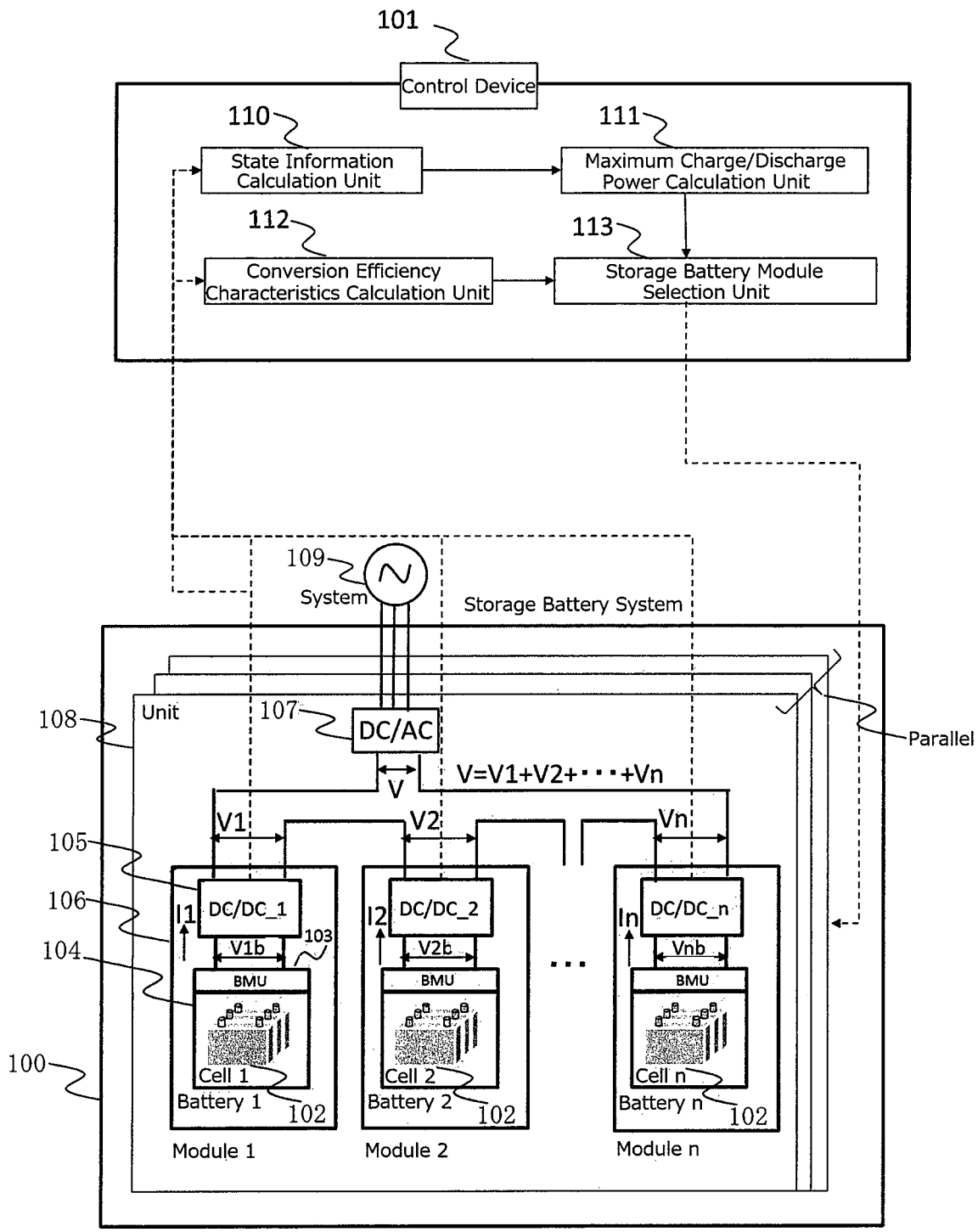
FIG. 1 is a configuration diagram of a storage battery system and a control device for the storage battery system according to a first embodiment of the present invention.

FIG. 1 is a configuration diagram of a storage battery system 100 and a control device 101 for the storage battery system 100 according to a first embodiment of the present invention.

(Configuration of Storage Battery System 100)

Now, a configuration of the storage battery system 100 is described. In the storage battery system 100, a battery 104 is made by connecting a plurality of cells 102 connected in series and in parallel to a BMU 103.

A storage battery module 106 is made by connecting the battery 104 and a DC/DC converter 105 to each other. A storage battery unit 108 is made by connecting a plurality of storage battery modules 106 connected in series to a DC/AC converter 107.

The storage battery system 100 is made by optionally connecting a plurality of storage battery units 108 in parallel. The storage battery system 100 is connected to a power system 109. The power system 109 is a general power system, a load, a solar power generation system, or the like.

A detailed description of each of the components of the storage battery system 100 is given below.

(Cell 102)

The cell 102 is the minimum unit of the components of the storage battery system 100. The cell 102 is made of a rechargeable battery that can be charged/discharged, such as a lithium-ion battery, a nickel-hydrogen battery or a lead storage battery.

(BMU 103)

The battery management unit (BMU) 103 has state management functions such as voltage measurement, current measurement, power measurement, temperature measurement and remaining capacity management of the cells 102. Various types of data measured by the BMU 103 are transmitted to the DC/DC converter 105.

In the BMU 103, the lower/upper limit voltages, the maximum charge/discharge currents, the highest cell temperature, or the like of the cells 102 are preset. The BMU 103 thus has a protection function of preventing such as over-charging, over-discharging, over-voltage, over-current and illegal temperature of the cells 102.

(Battery 104)

The battery 104 is made by connecting the plurality of cells 102 connected in series and in parallel to the BMU 103.

(DC/DC Converter 105)

The DC/DC converter 105 is configured to step-up and step-down the input voltage of the battery 104 during the charging process, and to step-up and step-down the output voltage of the battery 104 during the discharging process. The DC/DC converter 105 may have an insulation configuration or a non-insulation configuration.

The DC/DC converter 105 has a function of measuring the voltage and the current before the conversion, and the voltage and the current after the conversion. Specifically, the DC/DC converter 105 is configured to measure the input voltage and the input current of the storage battery module 106 and the input voltage and the input current of the battery 104 during the charging process of the storage battery system 100. The DC/DC converter 105 is also configured to measure the output voltage and the output current of the battery 104 and the output voltage and the output current of the storage battery module 106 during the discharging process of the storage battery system 100.

Further, the DC/DC converter 105 has a function of measuring a temperature of the battery 104. The temperature of the battery 104 is defined as e.g. an average value of the temperatures of the plurality of cells 102, or the maximum value of the temperatures of the plurality of cells 102.

The various types of data measured by the DC/DC converter 105 are transmitted to the control device 101.

(Storage Battery Module 106)

The storage battery module 106 is made of the battery 104 and the DC/DC converter 105.

(DC/AC Converter 107)

During the charging process of the storage battery system 100, the DC/AC converter 107 converts an AC power input from the power system 109 to the storage battery unit 108 into a DC power, to thereby supply the DC power to each of the storage battery modules 106 connected in series. During the discharging process of the storage battery system 100, the DC/AC converter 107 converts a DC power output from each of the storage battery modules 106 connected in series into an AC power, to thereby output the AC power to the power system 109.

(Storage Battery Unit 108)

The storage battery unit 108 is made by connecting the plurality of storage battery modules 106 in series.

(Storage Battery System 100)

The storage battery system 100 is made by connecting the plurality of storage battery units 108 in parallel.

(Configuration of Control Device 101)

Next, a configuration of the control device 101 is described below. The control device 101 comprises a state information calculator 110, a maximum charge/discharge power calculator 111, a conversion efficiency characteristics calculator 112 and a storage battery module selector 113.

(State Information Calculator 110)

The state information calculator 110 is configured to calculate state information including such as a voltage, a state of charge, a temperature and an internal resistance of the battery 104 of each storage battery module 106.

(Maximum Charge/Discharge Power Calculator 111)

The maximum charge/discharge power calculator 111 is configured to calculate the maximum charge/discharge power of each storage battery module 106 based on the state information on the battery 104 of each storage battery module 106 calculated by the state information calculator 110.

(Conversion Efficiency Characteristics Calculator 112)

The conversion efficiency characteristics calculator 112 is configured to calculate a power conversion efficiency of each DC/DC converter 105 based on the voltage and the current before the conversion and the voltage and the current after the conversion by the DC/DC converter 105 of each storage battery module 106.

(Storage Battery Module Selector 113)

The storage battery module selector 113 is configured to select one or a plurality of storage battery modules 106 to be used while the storage battery system 100 is charged/discharged and to determine the charge/discharge power of each selected storage battery module 106, based on the state information on the battery 104 of each storage battery module 106 calculated by the state information calculator 110, the maximum charge/discharge power of each storage battery module 106 calculated by the maximum charge/discharge power calculator 111 and the power conversion efficiency of the DC/DC converter 105 of each storage battery module 106 calculated by the conversion efficiency characteristics calculator 112.

(Control of Storage Battery System 100)

Figure 2:
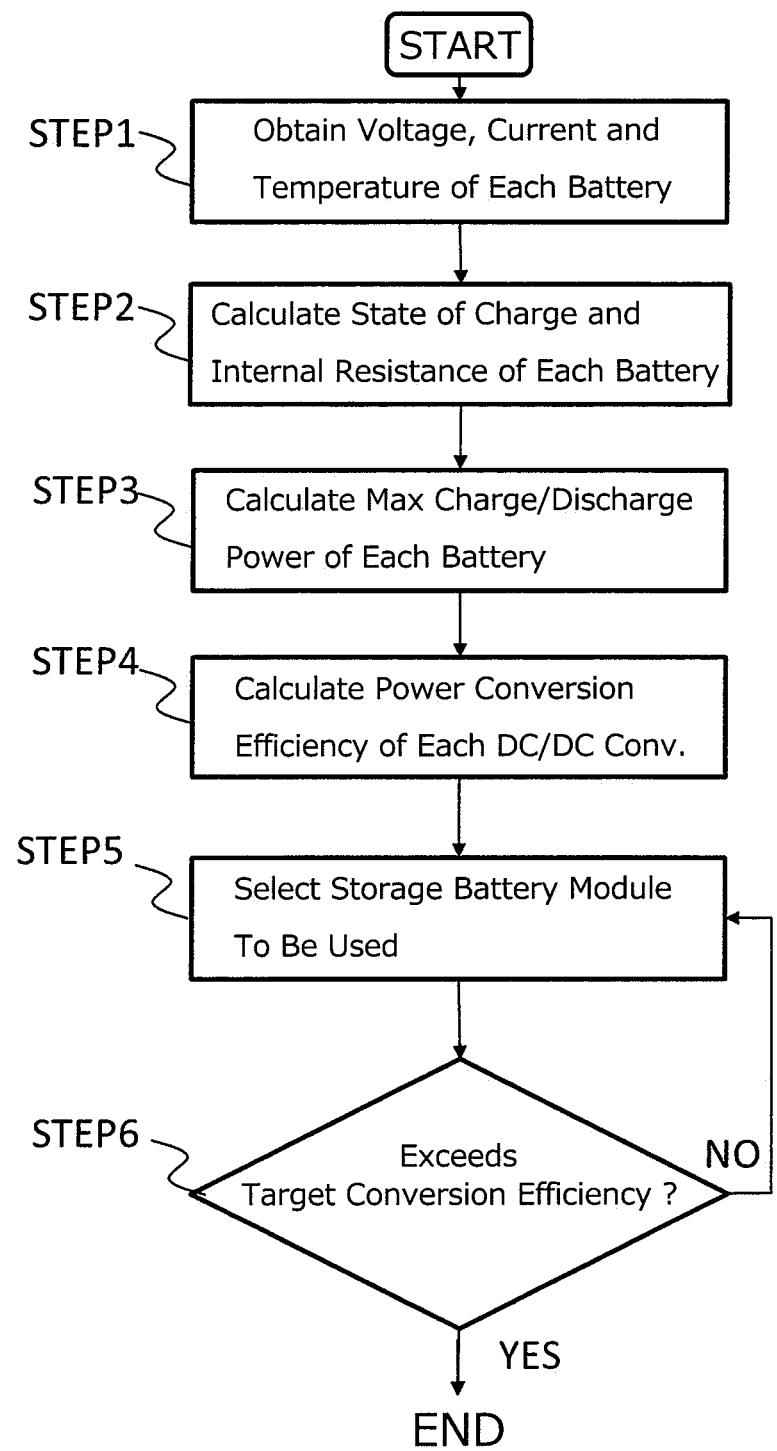
FIG. 2 is a flowchart for illustrating a process executed by the control device for the storage battery system according to the first embodiment of the present invention.

With reference to a flowchart of FIG. 2, a detailed description is now given of the control of the storage battery system 100 performed by the control device 101 according to the first embodiment of the present invention.

In STEP 1, the state information calculator 110 obtains, from the DC/DC converter 105, information on the voltage, the current and the temperature of the battery 104 connected to the DC/DC converter 105 of each storage battery module 106.

In STEP 2, the state information calculator 110 calculates the state of charge and the internal resistance of the battery 104 of each storage battery module 106 based on the information on the voltage, the current and the temperature of the battery 104 obtained in STEP 1.

As a method of calculating the state of charge of the battery 104, various general methods can be used. As an example, a method based on a current integration method is described below.

When calculating the state of charge of the battery 104 based on the current integration method, the start time of charging of the battery 104 is set as a start time of integration to integrate a current flowing into the battery 104.

$$SOC(t) = \frac{1}{FCC} \int_0^t I dt + SOC(0) \qquad [\text{Equation (1)}]$$

In the equation above, SOC(t) represents the state of charge of the battery 104, FCC represents a full charge capacity of the battery 104 and SOC(0) represents a state of charge of the battery 104 at the start time of charging. The full charge capacity is a state of charge obtained when the battery 104 is charged at a specified current within the range of a specified voltage.

Further, as a method of calculating the internal resistance of the battery 104, various general methods can be used. As an example, a calculation method based on the Ohm's law is described.

The internal resistance of the battery 104 can be calculated by obtaining a voltage V and a current I of the battery 104 within a certain time range and inserting them into the relationship "R=V/I". The internal resistance gradually increases as degradation of the plurality of cells 102 included in the battery 104 progresses. The internal resistance presents a low value when the temperatures of the cell 102 are high. The internal resistance presents a high value when the temperatures of the cells 102 are low.

Although the internal resistance changes in accordance with the temperatures, a degree of the degradation of the battery 104 can be calculated by comparing the internal resistances at the same temperature. That is, the internal resistance includes information on the degradation of the battery 104.

In STEP 3, the maximum charge/discharge power calculator 111 calculates the maximum charge/discharge power of each storage battery module 106 based on the voltage, the temperature, the state of charge and the internal resistance of the battery 104 calculated in STEP 1 and STEP 2.

The maximum charge/discharge power of the storage battery module 106 is the maximum charge power or the maximum discharge power of the storage battery module 106. More specifically, the maximum charge/discharge power of the storage battery module 106 takes a negative value as the maximum discharge power when the storage battery system 100 is discharged. The maximum charge/discharge power of the storage battery module 106 takes a positive value as the maximum charge power when the storage battery system 100 is charged. Regarding the sign of the charge/discharge power, it is assumed that the charge current is expressed as positive and the discharge current is expressed as negative.

In general, the upper/lower limit voltages and the maximum charge/discharge currents of the storage battery system 100 are determined by a manufacturer in consideration of safety. Therefore, it is desired that the storage battery system 100 is used without deviating from the ranges of those limits.

In general, the charge/discharge power W of the storage battery system 100 is expressed as a product of the voltage V and the charge/discharge current I of the storage battery module 106. Thus, it is desired that the voltage V of the storage battery module 106 is within the range between the upper limit voltage and the lower limit voltage. It is also desired that the charge/discharge current I is equal to or smaller than the maximum charge/discharge current.

The charge/discharge current of the storage battery module 106 is a charge current or a discharge current of the storage battery module 106. More specifically, the charge/discharge current of the storage battery module 106 takes a negative value as the discharge current when the storage battery system 100 is discharged. The charge/discharge current of the storage battery module 106 takes a positive value as the charge current when the storage battery system 100 is charged.

The BMU 103 manages the upper limit voltage Vu, the lower limit voltage Vl, the open circuit voltage Vo, the internal resistance R, the maximum charge current Ichmax and the maximum discharge current Idsmax of the storage battery module 106.

Figure 3:
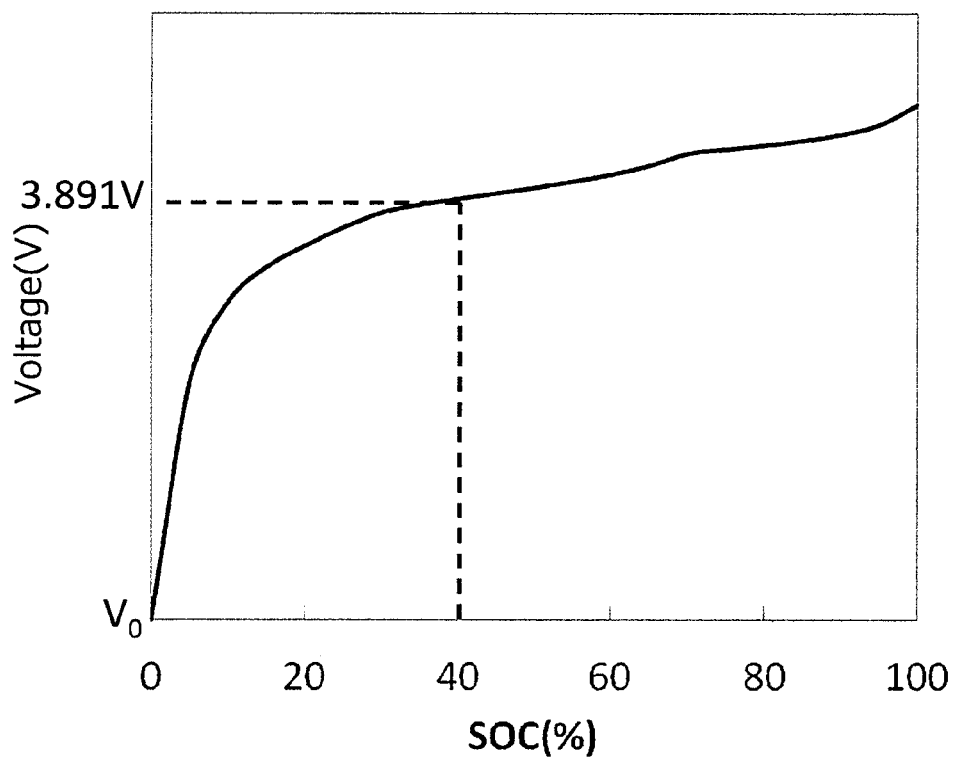
FIG. 3 is a graph for showing an example of an SOC-OCV curve of a storage battery module in the first embodiment of the present invention.

The open circuit voltage Vo can be obtained by converting the state of charge SOC of the storage battery module 106 into the open circuit voltage Vo in accordance with an SOC-OCV curve shown in FIG. 3.

The maximum charge power Pchmax is given by Equation (2) expressed in the form of voltage.

$$P_{chmax} = \frac{V_u - V_o}{R} \times V_u \qquad \text{[Equation (2)]}$$

The maximum charge power Pchmax is also given by Equation (3) expressed in the form of current.

$$P_{chmax} = I_{chmax}^2 \times R \qquad \text{[Equation (3)]}$$

Therefore, the output that does not reach the voltage restriction given by Equation (2) or the output that does not reach the current restriction given by Equation (3) will be the maximum charge power Pchmax.

Similarly, the maximum discharge power Pdsmax is given by Equation (4) expressed in the form of voltage.

$$P_{dsmax} = \frac{V_o - V_u}{R} \times V_u \qquad \text{[Equation (4)]}$$

The maximum discharge power Pdsmax is also given by Equation (5) expressed in the form of current.

$$P_{dsmax} = I_{dsmax}^2 \times R \qquad \text{[Equation (5)]}$$

Therefore, the output that does not reach the voltage restriction given by Equation (4) or the output that does not reach the current restriction given by Equation (5) will be the maximum discharge power Pdsmax.

In normal, it is expected that the maximum charge/discharge power is determined by the current restriction given by Equation (3) or Equation (5). However, when the storage battery module 106 is used around the upper limit voltage or the lower limit voltage, the maximum charge/discharge power may be determined not by the current restriction but by the voltage restriction given by Equation (2) or Equation (4).

In STEP 4, the conversion efficiency characteristics calculator 112 calculates a power conversion efficiency α of the DC/DC converter 105 of each storage battery module 106.

Figure 4:
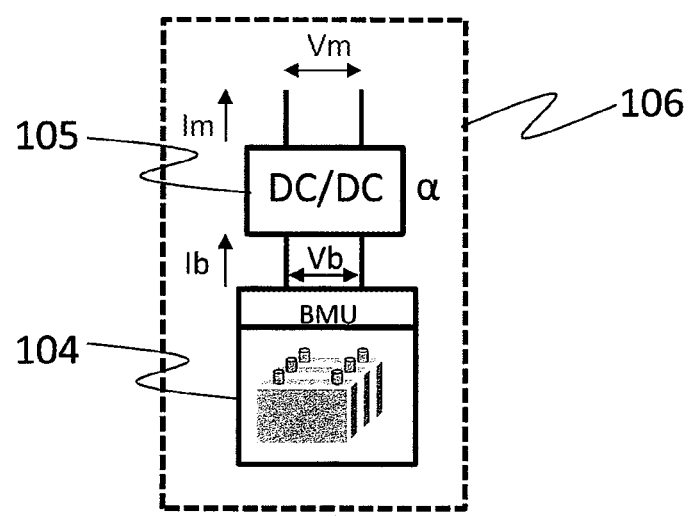
FIG. 4 is a diagram for illustrating a power conversion efficiency of a DC/DC converter of the storage battery module in the first embodiment of the present invention.

Specifically, the conversion efficiency characteristics calculator 112 calculates the power conversion efficiency α of the DC/DC converter 105 of each storage battery module 106, based on the voltage Vb and the current Ib on the battery 104 side and the voltage Vm and the current Im on an opposite side of the battery 104 according to Equation (6) (see FIG. 4).

$$\alpha = (V_m \times I_m)/(V_b \times I_b) \qquad \text{[Equation (6)]}$$

The current Ib and the current Im in Equation (6) take negative values when the storage battery system 100 is discharged. The current Ib and the current Im in Equation (6) take positive values when the storage battery system 100 is charged.

In STEP 5, the storage battery module selector 113 selects one or a plurality of storage battery modules 106 to be used when the storage battery system 100 is charged/discharged.

Specifically, when the storage battery system 100 is discharged, the storage battery module selector 113 selects one or a plurality of storage battery modules 106 to be used while the storage battery system 100 is discharged, based on the maximum discharge power Pdsmax of each storage battery module 106 calculated in STEP 3 and the power conversion efficiency α of the DC/DC converter 105 calculated in STEP 4.

Further, when the storage battery system 100 is discharged, the storage battery module selector 113 selects one or a plurality of storage battery modules 106 to be used while the storage battery system 100 is charged, based on the maximum charge power Pchmax of each storage battery module 106 calculated in STEP 2 and the power conversion efficiency α of the DC/DC converter 105 calculated in STEP 4.

With reference to FIG. 5 to FIG. 9, specific selection methods for one or a plurality of storage battery modules 106 to be used during the charging/discharging process are described in order.

(1. When Output Request Directed to Storage Battery System 100 is High)

First, with reference to FIG. 5, a selection method is described below in the case when an output request Wreq directed to the storage battery system 100 is high.

It is assumed that the power conversion efficiencies α1 to αn of the DC/DC converters 105 of the storage battery modules 106 are known. It is also assumed that the maximum charge/discharge powers W1max to Wnmax of the storage battery modules 106 are higher than the output powers Wα1 to Wαn of the DC/DC converters 105 at the maximum conversion efficiencies, respectively.

Figure 5:
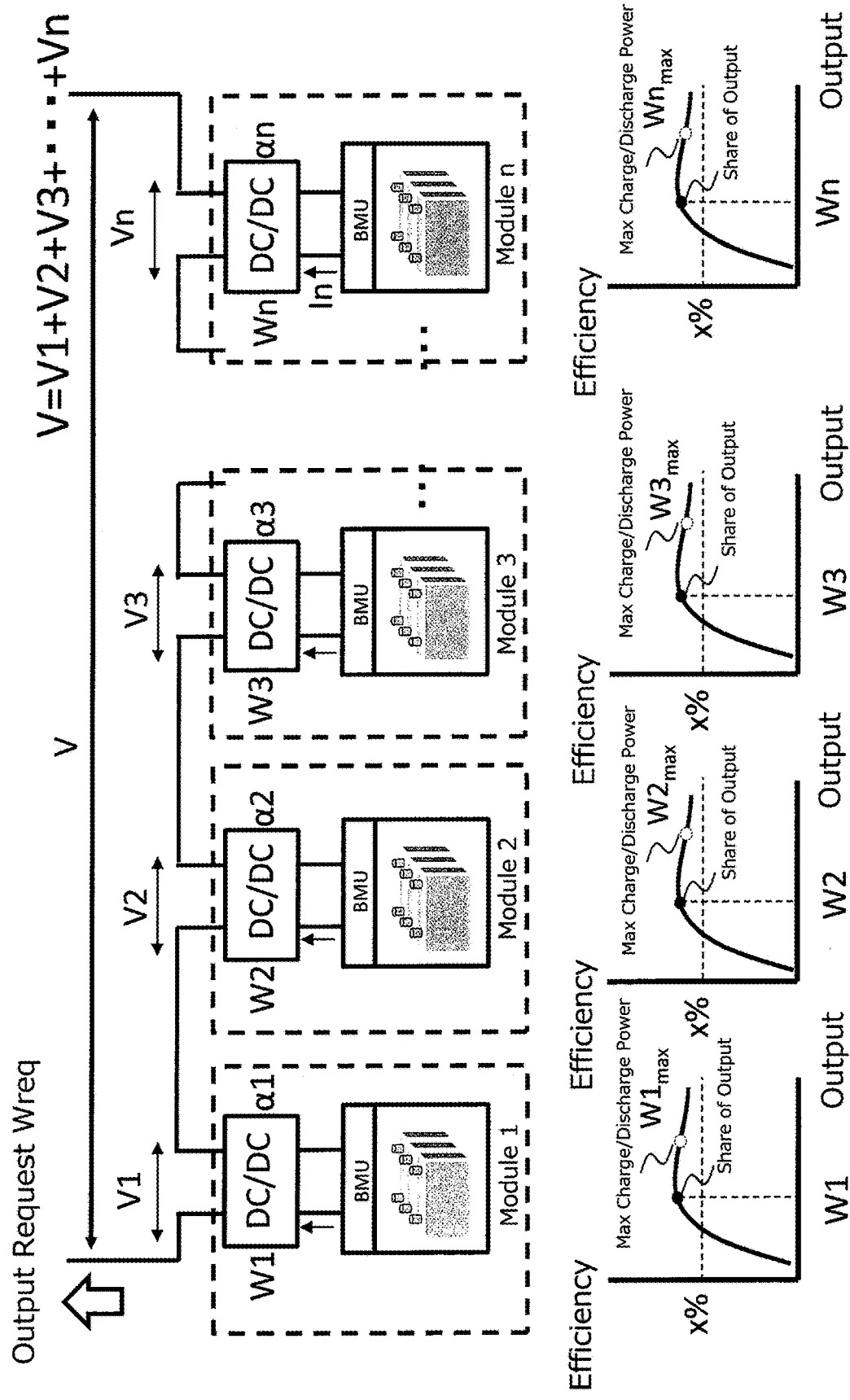
FIG. 5 is a diagram for illustrating a selection process executed by the control device for the storage battery system according to the first embodiment of the present invention when the output request is high.

In FIG. 5, the 1st to nth storage battery modules 106 are connected in series via the DC/DC converters 105. When the output request Wreq is negative, the storage battery system 100 is discharged. When the output request Wreq is positive, the storage battery system 100 is charged.

The storage battery module selector 113 determines the output power W of the storage battery system 100 based on the output request Wreq. When the output request Wreq is positive, the output power W is also positive. When the output request Wreq is negative, the output power W is also negative.

After that, the storage battery module selector 113 selects one or a plurality of storage battery modules 106 to be used during the charging/discharging, based on the output W of the storage battery system 100, the maximum charge/discharge powers W1max to Wnmax of the storage battery modules 106 and the power conversion efficiencies α1 to αn of the DC/DC converters 105.

Further, the storage battery module selector 113 determines the charge/discharge powers W1 to Wn of the selected one or plurality of storage battery modules 106.

Specifically, the storage battery module selector 113 determines one or a plurality of storage battery modules 106 to be used during the charging/discharging and the charge/discharge powers thereof as follows.

First, the sum of the voltages V1 to Vn of the storage battery modules 106 is equal to the output voltage V of the storage battery system 100, and thus Equation (7) is satisfied.

$$V_1+V_2+V_3+\ldots+V_n=V \qquad [\text{Equation (7)}]$$

As described above, Equation (8) is satisfied between the output power Wb of the battery 104 and the output power Wm of the DC/DC converter 105, i.e. the output power Wm of the storage battery module, using the power conversion efficiency α (see FIG. 5).

$$W_b=\alpha W_m \qquad [\text{Equation (8)}]$$

This equation can be rearranged to Equation (9) using the output voltage Vb and the output current Ib of the battery 104 and the output voltage Vm and the output current Im of the storage battery module 106.

$$V_b I_b = \alpha V_m I_m \qquad [\text{Equation (9)}]$$

This equation can be rearranged to Equation (10) in terms of the output current Ib of the battery 104.

$$I_b = \alpha \frac{V_m}{V_b} I_m \qquad [\text{Equation (10)}]$$

Thus, the output current Ib of the battery 104 can be controlled indirectly by controlling the output voltage Vm of the storage battery module 106.

Next, the output powers of the DC/DC converters 105 at the maximum conversion efficiencies are defined as Wα1 to Wαn. In this description, it is assumed that the characteristics of the DC/DC converters 105 are different from one another. However, if those characteristics are identical, Wα1=Wα2= . . . =Wαn is satisfied.

The storage battery module selector 113 distributes the output power W of the storage battery system 100 to the storage battery modules 106 based on the ratio among the output powers Wα1 to Wαn at the maximum conversion efficiencies of the DC/DC converters 105.

Here, the sum of the output powers of the DC/DC converters 105 at the maximum conversion efficiencies is defined as Wα1+Wα2+ . . . +Wαn=Wdc. In this case, the output powers to be output by the 1st to nth storage battery modules 106 are given by Equation (11).

$$W_1 = (W \times W_{\alpha 1})/W_{dc} \qquad [\text{Equation (11)}]$$
$$W_2 = (W \times W_{\alpha 2})/W_{dc}$$
$$\vdots$$
$$W_n = (W \times W_{\alpha n})/W_{dc}$$

In FIG. 5, when the output request Wreq is sufficiently high, the power conversion efficiencies α1 to αn of the DC/DC converters 105 are satisfactory. Therefore, the storage battery module selector 113 selects all of the 1st to nth storage battery modules 106 as one or a plurality of storage battery modules 106 to be used during the charging/discharging.

The storage battery module selector 113 determines the output powers W1 to Wn of the 1st to nth storage battery modules 106 to be the output powers Wα1 to Wαn at the maximum conversion efficiencies, respectively.

In STEP 6, the storage battery module selector 113 determines whether each of the power conversion efficiencies α1 to αn of the DC/DC converters 105 is higher than a target power conversion efficiency X.

In this description, it is assumed that the output request Wreq is sufficiently high, and all of the power conversion efficiencies α1 to αn of the DC/DC converters 105 are satisfactory and exceed the target power conversion efficiency X (STEP 6=YES). Under this assumption, the storage battery module selector 113 finishes the selection.

(2. When Output Request Directed to Storage Battery System 100 is Low)

Figure 6:
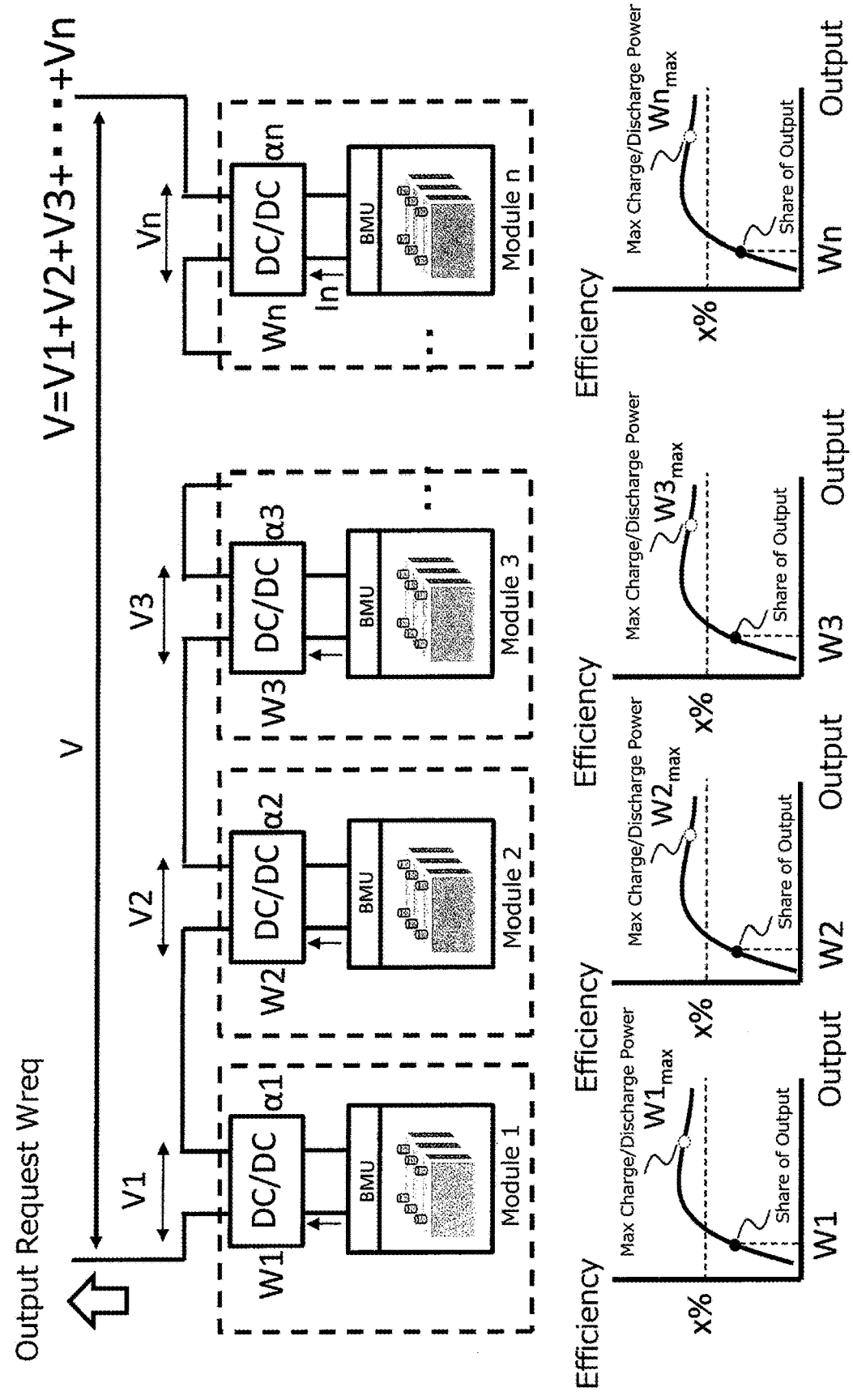
FIG. 6 is a first diagram for illustrating a selection process executed by the control device for the storage battery system according to the first embodiment of the present invention when the output request is low.
Figure 7:
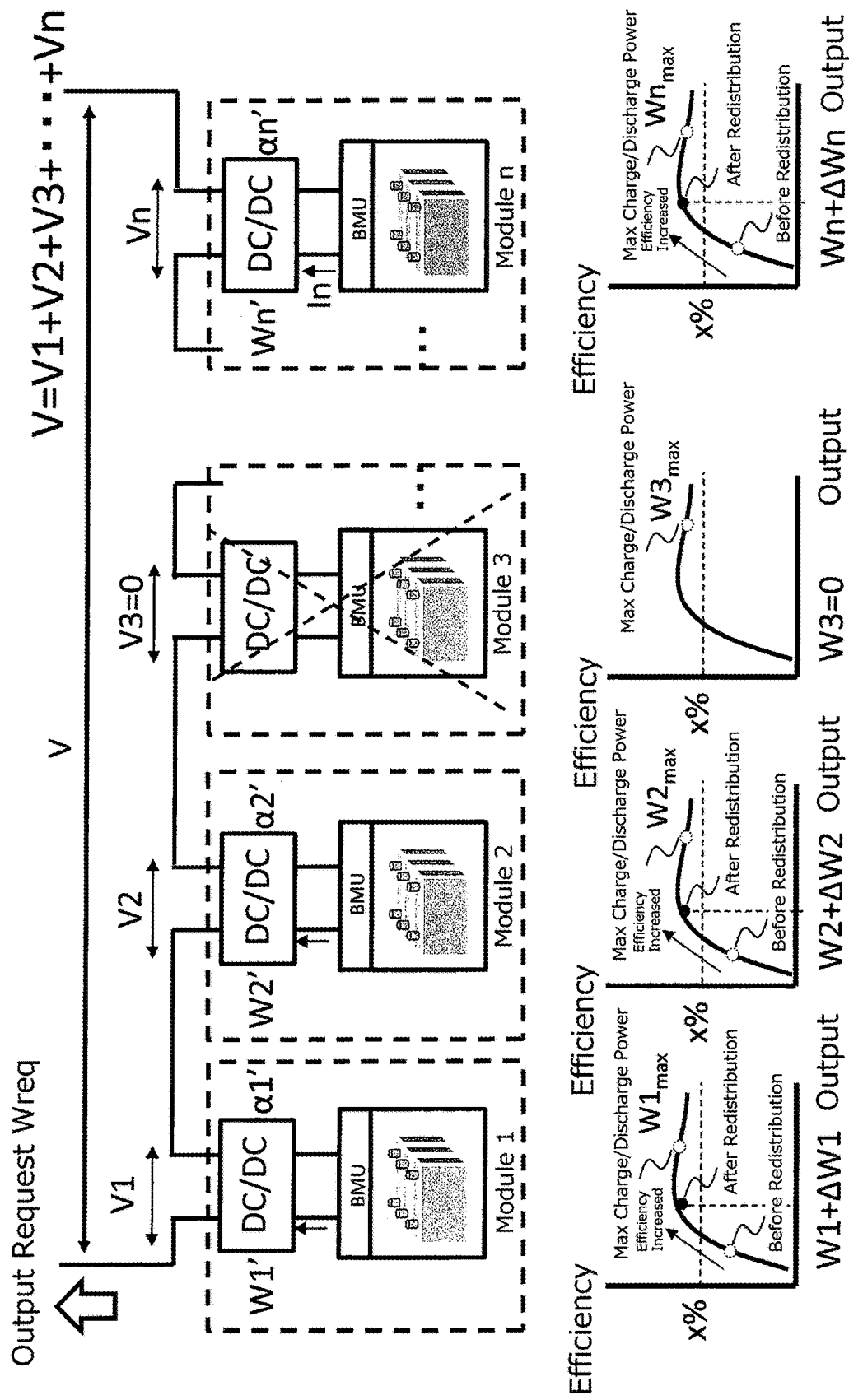
FIG. 7 is a second diagram for illustrating the selection process executed by the control device for the storage battery system according to the first embodiment of the present invention when the output request is low.

With reference to FIG. 6 and FIG. 7, a selection method is described below in the case when the output request Wreq directed to the storage battery system 100 is low.

It is assumed that the power conversion efficiencies α1 to αn of the DC/DC converters 105 of the storage battery modules 106 are known. It is also assumed that the maximum charge/discharge powers W1max to Wnmax of the storage battery modules 106 are higher than the output powers Wα1 to Wαn of the DC/DC converters 105 at the maximum conversion efficiencies, respectively.

FIG. 6 shows a relationship between the output powers W1 to Wn and the power conversion efficiencies α1 to αn of the storage battery modules 106 when the output request Wreq is low. When the output request Wreq is low, the power conversion efficiencies α1 to αn of the DC/DC converters 105 decrease and fall below the target power conversion efficiency X.

In STEP 5, as in the case of FIG. 5, the storage battery module selector 113 first distributes the output power W of the storage battery system 100 to the storage battery modules 106 based on the ratio among the output powers Wα1 to Wαn at the maximum conversion efficiencies of the DC/DC converters 105.

$$W_1 = (W \times W_{\alpha 1})/W_{dc} \qquad [\text{Equation (12)}]$$
$$W_2 = (W \times W_{\alpha 2})/W_{dc}$$
$$\vdots$$
$$W_n = (W \times W_{\alpha n})/W_{dc}$$

Next, the storage battery module selector 113 selects a storage battery module 106 of which the current power conversion efficiency is equal to or lower than the target power conversion efficiency X from among the storage battery modules 106, and stops the use of the selected storage battery module 106.

Specifically, for each DC/DC converter 105 of the respective storage battery modules 106, the storage battery module selector 113 calculates a difference between the target power conversion efficiency X and the current power conversion efficiency.

The storage battery module selector 113 selects the storage battery module 106 with the largest difference, and stops the use of the selected storage battery module 106.

In FIG. 6, it is assumed that the 3rd storage battery module 106 has the largest difference. In this case, as illustrated in FIG. 7, the output power W3 initially output by the 3rd storage battery module 106 is redistributed to the other storage battery modules 106.

Specifically, the increases in output power to be output by each storage battery module 106 other than the 3rd storage battery module is given by Equation (13).

$$\Delta W_1 = W_1 \times \left(\frac{W_{\alpha 1}}{W_{dc} - W_{\alpha 1}}\right) \quad [\text{Equation (13)}]$$
$$\Delta W_2 = W_2 \times \left(\frac{W_{\alpha 2}}{W_{dc} - W_{\alpha 2}}\right)$$
$$\Delta W_4 = W_4 \times \left(\frac{W_{\alpha 4}}{W_{dc} - W_{\alpha 4}}\right)$$
$$\vdots$$
$$\Delta W_n = W_n \times \left(\frac{W_{\alpha n}}{W_{dc} - W_{\alpha n}}\right)$$

In STEP 6, the storage battery module selector 113 determines whether each of the power conversion efficiencies $\alpha 1'$, $\alpha 2'$, $\alpha 4'$, ..., $\alpha n'$ of the DC/DC converters 105 is higher than the target power conversion efficiency X.

In this description, it is assumed that the use of the 3rd storage battery module 106 is stopped, and the power conversion efficiencies $\alpha 1'$, $\alpha 2'$, $\alpha 4'$, ..., $\alpha n'$ of the remaining DC/DC converters 105 thus increase and exceed the target power conversion efficiency X. Under this assumption, the storage battery module selector 113 finishes the selection (STEP 6=YES).

As described above, when selecting one or a plurality of storage battery modules to be used during the charging/discharging, the power conversion efficiency of the storage battery system 100 can be increased by stopping the use of the storage battery module 106 with a low power conversion efficiency and increasing the output powers of the other storage battery modules 106.

(3. When Maximum Charge/Discharge Powers of Storage Battery Modules 106 Fall Below Output Powers of DC/DC Converters 105 at Maximum Conversion Efficiencies)

Figure 8:
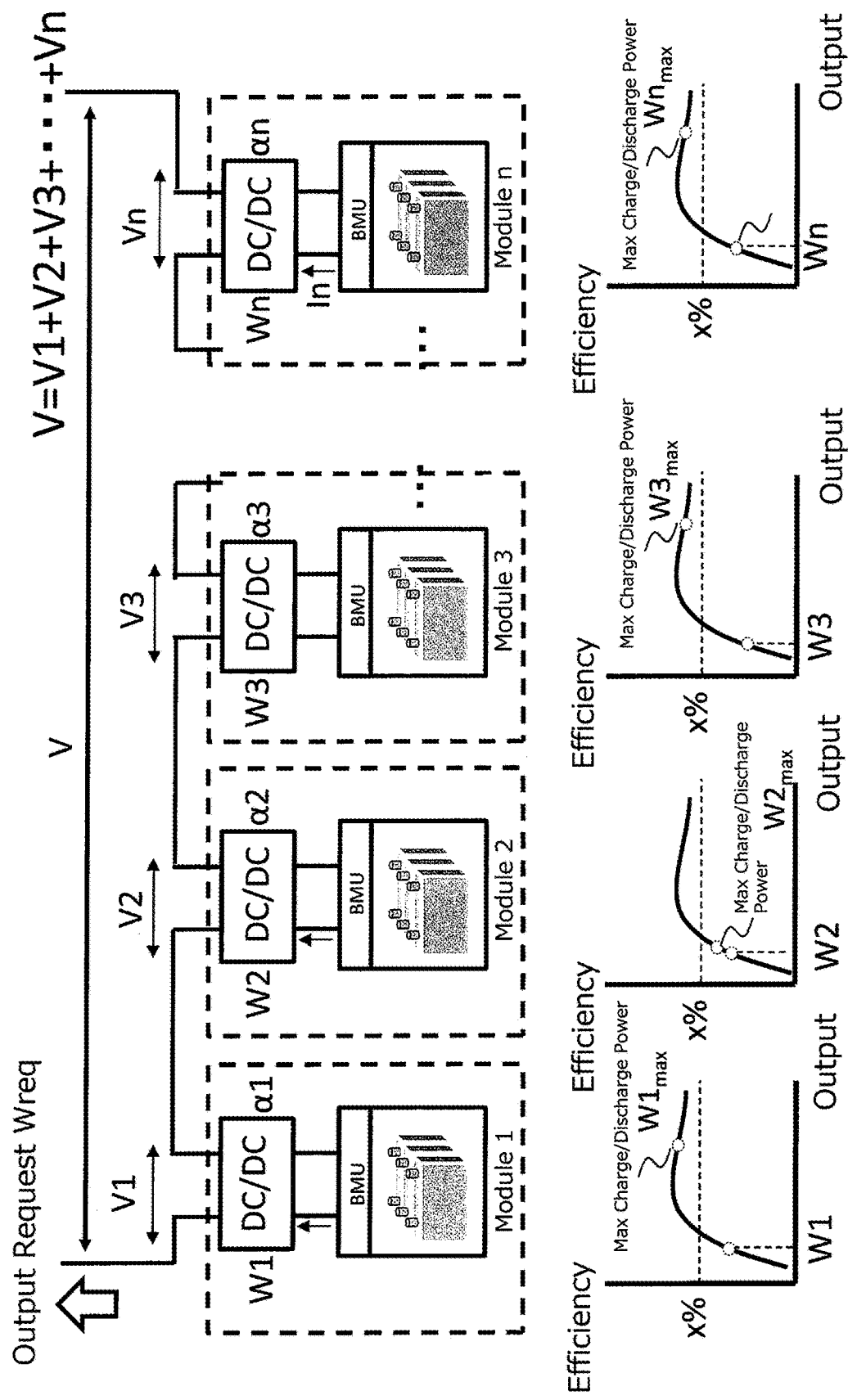
FIG. 8 is a first diagram for illustrating a selection process executed by the control device for the storage battery system according to the first embodiment of the present invention when the maximum charge/discharge power of each storage battery module is lower than the output power of each DC/DC converter at the maximum conversion efficiency.
Figure 9:
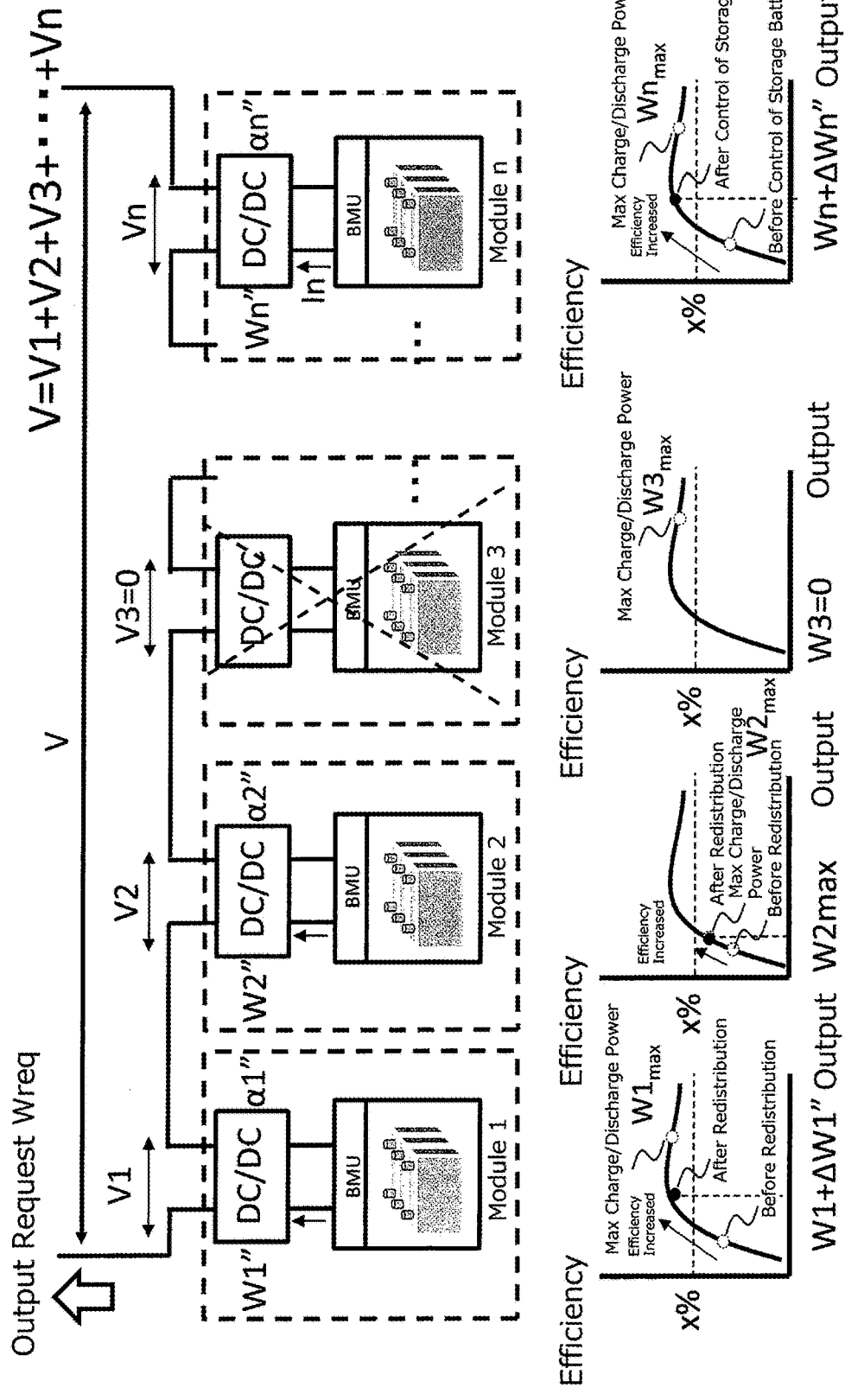
FIG. 9 is a second diagram for illustrating the selection process executed by the control device for the storage battery system according to the first embodiment of the present invention when the maximum charge/discharge power of each storage battery module is lower than the output power of each DC/DC converter at the maximum conversion efficiency.

With reference to FIG. 8 and FIG. 9, a selection method is described below in the case when the maximum charge/discharge powers W1max to Wnmax of the storage battery modules 106 fall below the output powers $W\alpha 1$ to $W\alpha n$ of the DC/DC converters 105 at the maximum conversion efficiencies, respectively.

In FIG. 5 and FIG. 6, it is assumed that the maximum charge/discharge powers W1max to Wnmax of the storage battery modules 106 exceed the output powers $W\alpha 1$ to $W\alpha n$ of the DC/DC converters 105 at the maximum conversion efficiencies, respectively.

In contrast, FIG. 8 shows the case when the maximum charge/discharge powers W1max to Wnmax of the storage battery modules 106 fall below the output powers $W\alpha 1$ to $W\alpha n$ of the DC/DC converters 105 at the maximum conversion efficiencies, respectively.

It is assumed that the power conversion efficiencies al to an of the DC/DC converters 105 of the storage battery modules 106 are known.

In STEP 5, as in the case of FIG. 5 and FIG. 6, the storage battery module selector 113 first distributes the output power W of the storage battery system 100 to the storage battery modules 106 based on the ratio among the output powers $W\alpha 1$ to $W\alpha n$ at the maximum conversion efficiencies of the DC/DC converters 105.

$$W_1 = (W \times W_{\alpha 1})/W_{dc} \quad [\text{Equation (14)}]$$
$$W_2 = (W \times W_{\alpha 2})/W_{dc}$$
$$\vdots$$
$$W_n = (W \times W_{\alpha n})/W_{dc}$$

Next, the storage battery module selector 113 selects a storage battery module 106 of which the current power conversion efficiency is equal to or lower than the target power conversion efficiency X from among the storage battery modules 106, and stops the use of the selected storage battery module 106.

Specifically, for each DC/DC converter 105, the storage battery module selector 113 calculates a difference between the target power conversion efficiency X and the current power conversion efficiency.

The storage battery module selector 113 selects the storage battery module 106 with the largest difference, and stops the use of the selected storage battery module 106.

In FIG. 8, it is assumed that the 3rd storage battery module 106 has the largest difference. In this case, as illustrated in FIG. 9, the output power W3 initially output by the 3rd storage battery module 106 is redistributed to the other storage battery modules 106.

Specifically, the increases in output power to be output by each storage battery module 106 other than the 3rd storage battery module is given by Equation (15).

$$\Delta W_1 = W_1 \times \left(\frac{W_{\alpha 1}}{W_{dc} - W_{\alpha 1}}\right) \quad [\text{Equation (15)}]$$
$$\Delta W_2 = W_2 \times \left(\frac{W_{\alpha 2}}{W_{dc} - W_{\alpha 2}}\right)$$
$$\Delta W_4 = W_4 \times \left(\frac{W_{\alpha 4}}{W_{dc} - W_{\alpha 4}}\right)$$
$$\vdots$$
$$\Delta W_n = W_n \times \left(\frac{W_{\alpha n}}{W_{dc} - W_{\alpha n}}\right)$$

Considering the case when the output power W2+ΔW2 of the 2nd storage battery module 106 after the redistribution is higher than the maximum charge/discharge power W2max, i.e. the case when W2+ΔW2>W2max is satisfied. In this case, the storage battery module selector 113 determines the output power W2 of the second storage battery module 106 to be the maximum charge/discharge power W2max.

Moreover, the storage battery module selector 113 further redistributes the power that cannot be output by the 2nd storage battery module 106, i.e. W2+ΔW2−W2max, to the other 1st and 4th to nth storage battery modules 106.

In STEP 6, the storage battery module selector 113 determines whether each of the power conversion efficiencies $\alpha 1''$, $\alpha 2''$, $\alpha 4''$, ..., $\alpha n''$ of the DC/DC converters 105 is higher than the target power conversion efficiency X.

In this description, it is assumed that the selection and the determination described above are executed, and the power conversion efficiencies $\alpha 1''$, $\alpha 2''$, $\alpha 4''$, ..., $\alpha n''$ of the remaining DC/DC converters 105 thus increase and exceed the target power conversion efficiency X. Under this assumption, the storage battery module selector 113 finishes the selection (STEP 6=YES).

(4. When Power Conversion Characteristics of DC/DC Converters 105 of Storage Battery Modules 106 are Identical to One Another)

Next, a selection method is described below in the case when the power conversion efficiencies a1 to an of the DC/DC converters 105 of the storage battery modules 106 are identical to one another.

When the power conversion efficiencies a1 to an of the DC/DC converters 105 of the storage battery modules 106 are identical to one another, the output power is equally distributed to the storage battery modules 106, respectively.

The storage battery module selector 113 selects the storage battery modules 106 to be used during the charging/discharging of the storage battery system 100 based on the state of charge, the internal resistance and the cell temperature of the battery 104 of each storage battery module 106, which are calculated by the state information calculator 110.

For example, when the storage battery system 100 is discharged, the battery 104 with a lower state of charge is less advantageous for discharging, and thus the storage battery module selector 113 stops the use of the storage battery modules 106 in ascending order of the state of charge of the battery 104.

When the storage battery system 100 is charged, the battery 104 with a higher state of charge is less advantageous for charging, and thus the storage battery module selector 113 stops the use of the storage battery modules 106 in descending order of the state of charge of the battery 104.

In the case when the batteries 104 of the storage battery modules 106 are different from one another in degree of degradation, the storage battery module selector 113 may stop the use of the storage battery module 106 in descending order of the degree of degradation of the battery 104 in order to achieve a high efficiency and a long life of the storage battery system 100.

In the case when the batteries 104 of the storage battery modules 106 are different from one another in temperature, the storage battery module selector 113 may stop the use of the storage battery module 106 in descending order of the temperature of the battery 104 in order to achieve a long life of the storage battery system 100.

Also, in the case when the DC/DC converters 105 are different from one another in power conversion efficiency, the storage battery module selector 113 may select the storage battery module 106 to be stopped based on the degree of degradation or the temperature of the battery. That is, when prioritizing a high conversion efficiency, the storage battery module selector 113 may select the storage battery module 106 to be stopped based on the characteristics of the DC/DC converters 105, i.e. the ratio among the output powers at the maximum conversion efficiencies. When prioritizing a long life, the storage battery module selector 113 may select the storage battery module 106 to be stopped based on the state of the battery 104, i.e. the degree of degradation or the temperature.

(5. When Power Conversion Characteristics of DC/DC Converters 105 of Storage Battery Modules 106 are Unknown)

Next, a selection method is described below in the case when the power conversion efficiencies of the DC/DC converters 105 of the storage battery modules 106 are unknown.

The power conversion efficiencies of the DC/DC converters 105 are unknown, e.g. in the case when a certain storage battery module 106 has been broken and replaced by another storage battery module with different characteristics or by a used storage battery module.

When the storage battery module selector 113 selects and turns of any one of the storage battery modules 106, and in that time if the power conversion efficiency of the storage battery system 100 increases, the storage battery module selector 113 stops the use of the selected storage battery module 106.

The storage battery module selector 113 repeats the above-mentioned operation, to thereby successively select the storage battery module 106 to be stopped. When the storage battery module selector 113 selects and turns off any one of the storage battery modules 106, and in that time if the power conversion efficiency of the storage battery system 100 decreases, the storage battery module selector 113 continues the use of the selected storage battery module 106.

Through the above-mentioned control, a storage battery module with different characteristics or a used storage battery module can be used, and hence an operation cost of the storage battery system can be reduced.

(6. Summary)

As described above, the device for controlling the storage battery system according to the first embodiment of the present invention has a plurality of storage battery modules connected in series and each of the storage battery modules including a battery and a DC/DC converter connected to the battery. The device comprises: a state information calculator configured to calculate state information on each of the batteries of the storage battery modules; a conversion efficiency characteristics calculator configured to calculate a power conversion efficiency of each of the DC/DC converters of the storage battery modules; and a storage battery module selector configured to select one or a plurality of storage battery modules to be used while the storage battery system is charged or discharged and to determine a charge power or a discharge power of each of the selected one or plurality of storage battery modules, based on the state information on the battery and the power conversion efficiencies of the DC/DC converters.

With the above-mentioned features, the device for controlling the storage battery system according to the first embodiment of the present invention can achieve a high power conversion efficiency even when a storage battery module with a different power conversion efficiency is included in the storage battery system.

In the first embodiment described above, the storage battery module selector 113 is configured to select one or a plurality of storage battery modules 106 so that the power conversion efficiency of each DC/DC converter 105 exceeds the target power conversion efficiency X. However, the present invention is not limited to this configuration.

The storage battery module selector 113 may be configured to select one or a plurality of storage battery modules 106 so that the power conversion efficiency of the entire storage battery system 100 reaches a predetermined target power conversion efficiency. For example, the storage battery module selector 113 may be configured to calculate the power conversion efficiency of the storage battery system 100 while the storage battery modules 106 selected in STEP 5 are charged/discharged as a post-selection charge/discharge efficiency, and to charge/discharge the selected storage battery modules 106 if the calculated post-selection charge/discharge efficiency exceeds the target power conversion efficiency.

Alternatively, the storage battery module selector 113 may be configured to calculate a power conversion efficiency of the storage battery system 100 while all of the storage battery modules are charged/discharged as a pre-selection charge/discharge efficiency in addition to the above-mentioned post-selection charge/discharge efficiency, and to charge/discharge the selected one or plurality of storage battery modules if the post-selection charge/discharge efficiency is higher than the pre-selection charge/discharge efficiency.

(Details of DC/DC Converter 105)

Figure 10:
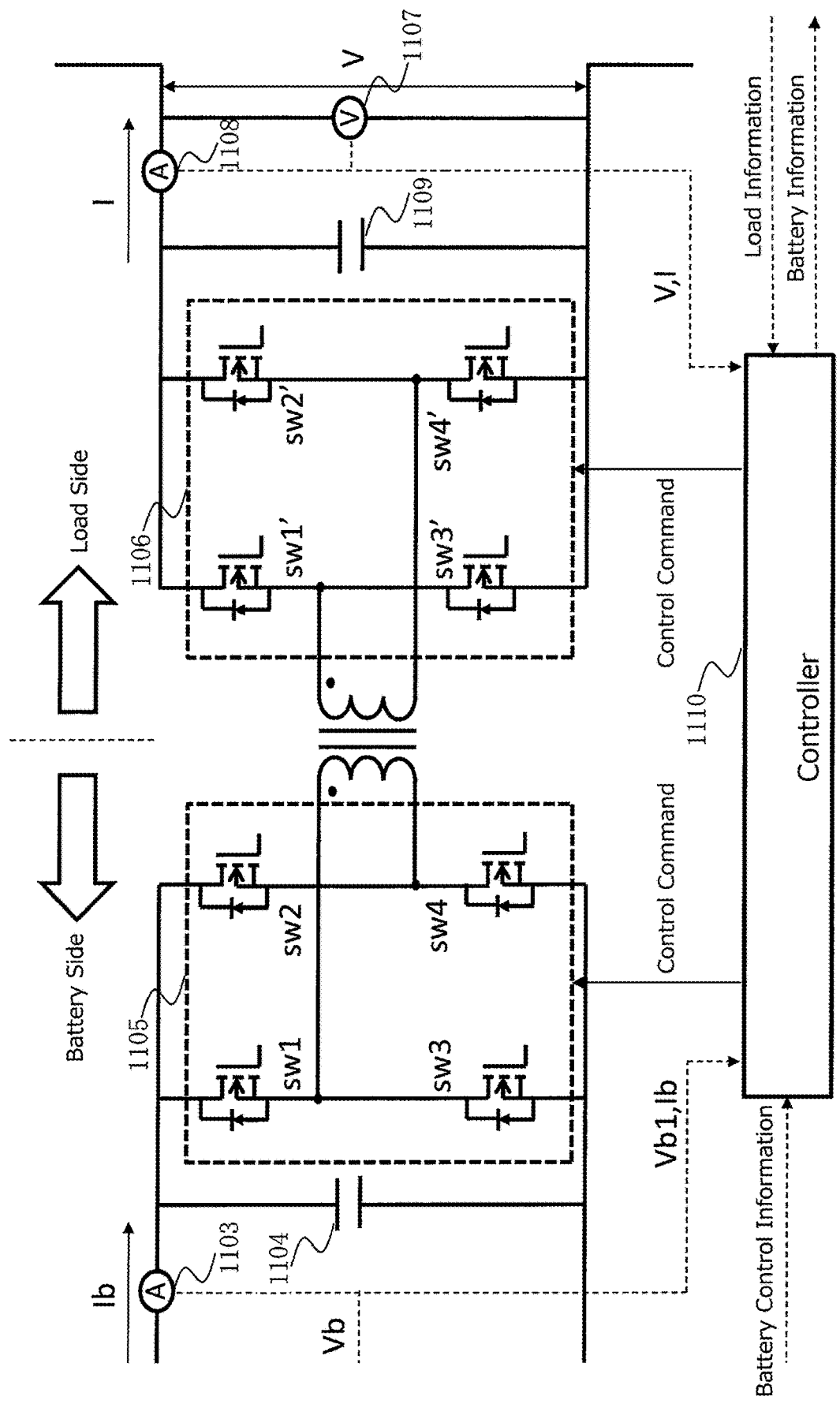
FIG. 10 is a diagram for illustrating details of the DC/DC converter in the first embodiment of the present invention.

Finally, with reference to FIG. 10, a supplementary description is given of details of the DC/DC converter 105 mounted to each storage battery module 106.

The DC/DC converter 105 comprises a voltmeter 1102, an ammeter 1103 and a capacitor 1104. The voltmeter 1102 is configured to measure a voltage of a battery 1101. The ammeter 1103 is configured to measure a current of the battery 1101. The capacitor 1104 is configured to smooth the input. A multi-layer capacitor, a chip capacitor, or the like can be used as the capacitor 1104.

Moreover, the DC/DC converter 105 comprises switches 1105 and 1106 configured to convert output of the battery 1101 into a desired output. MOS FETs, IGBTs, or the like may be used as switching elements sw1 to sw4 forming the switch 1105 and switching elements sw1' to sw4' forming the switch 1106.

Moreover, the DC/DC converter 105 comprises a voltmeter 1107, an ammeter 1108 and a capacitor 1109. The voltmeter 1107 is configured to measure a voltage after the output conversion. The ammeter 1108 is configured to measure a current after the output conversion. The capacitor 1109 is configured to smooth the output. A multi-layer capacitor, a chip capacitor, or the like can be used as the capacitor 1109.

Further, the DC/DC converter 105 comprises a controller 1110 configured to control turning on/off of the switches 1105 and 1106 based on battery information and load information.

The controller 1110 is configured to control turning on/off of the switches 1105 and 1106 via a control command, e.g. a PWM control signal, based on the battery information and the load information, to thereby convert the voltage of the battery into a desired voltage.

Moreover, the controller 1110 is configured to obtain battery control information from the BMU. Further, the controller 1110 is configured to obtain the voltage Vb and the current Ib of the battery 1101 before the conversion, and the voltage V and the current I of the battery 1101 after the conversion. The controller 1110 transmits those obtained information to the control device 101 as the battery information.

The controller 1110 is configured to turn off all of the switching elements sw1 to sw4 forming the switch 1105 on the battery side when the storage battery module selector 113 determines not to use the storage battery module 106 on which the controller 1110 is mounted.

Moreover, in this case, the controller 1110 turns on the switching elements sw1' to sw4' forming the switches 1106 on the load side. All of the switching elements sw1' to sw4' may be turned on, but the switching element sw1' and the switching element sw4' may be controlled so as to be turned on, and the switching element sw2' and the switching element sw3' may be controlled so as to be turned off, or the switching element sw1' and the switching element sw4' may be controlled so as to be turned off, and the switching element sw2' and the switching element sw3' may be controlled so as to be turned on.

Moreover, when electric charges are accumulated in the capacitor 1109 for smoothing the output, in order to prevent a large current from flowing through the switching elements sw1' to sw4' due to a short circuit, the controller 1110 may control the switching element sw1' and the switching element sw4' to be turned on and controls the switching element sw2' and the switching element sw3' to be turned off, or controls the switching element sw1' and the switching element sw4' to be turned off and controls the switching element sw2' and the switching element sw3' to be turned on so that the current flows through a transformer component. Further, the controller 1110 may be configured to charge the electric charges accumulated in the capacitor 1109 to the battery 1101 through the transformer component.

Description has been given through use of the DC/DC converter having the insulation configuration. However, when the circuit configuration allows separation of the battery 1101, a DC/DC converter having a non-insulation configuration may be used.

REFERENCE SIGNS LIST 100 storage battery system, 101 control device, 104 battery, 105 DC/DC converter, 106 storage battery module, 110 state information calculator, 111 maximum charge/discharge power calculator, 112 conversion efficiency characteristics calculator, 113 storage battery module selector.

The invention claimed is:

1. A device for controlling a storage battery system, the storage battery system having a plurality of storage battery modules connected in series and each of the storage battery modules including a battery and a DC/DC converter connected to the battery, the device comprising:
a processor including processing circuitry configured to calculate state information on each of the batteries of the storage battery modules;
the processor further configured to calculate a power conversion efficiency of each of the DC/DC converters of the storage battery modules; and
the processor further selects one or a plurality of storage battery modules to be used while the storage battery system is charged or discharged and to determine a charge power or a discharge power of each of the selected one or plurality of storage battery modules, based on the state information of the batteries and the power conversion efficiencies of the DC/DC converters,
wherein the processor selects the one or the plurality of storage battery modules to be used while the storage battery system is charged or discharged by stopping use of at least one of the plurality of storage battery modules.

2. The device according to claim 1, wherein the processor is configured to select the one or plurality of storage battery modules so that a power conversion efficiency of the storage battery system reaches a target power conversion efficiency.

3. A device for controlling a storage battery system, the storage battery system having a plurality of storage battery modules connected in series and each of the storage battery modules including a battery and a DC/DC converter connected to the battery, the device comprising:
a processor including processing circuitry configured to calculate state information on each of the batteries of the storage battery modules;
the processor further configured to calculate a power conversion efficiency of each of the DC/DC converters of the storage battery modules; and the processor further selects one or a plurality of storage battery modules to be used while the storage battery system is charged or discharged and to determine a charge power or a discharge power of each of the selected one or plurality of storage battery modules, based on the state information of the batteries and the power conversion efficiencies of the DC/DC converters, wherein the processor calculates a power conversion efficiency of the storage battery system while all of the storage battery modules are charged/discharged as a pre-selection charge/discharge efficiency, calculates a power conversion efficiency of the storage battery system while the selected one or plurality of storage battery modules are charged/discharged as a post-selection charge/discharge efficiency, and charges/discharges the selected one or plurality of storage battery modules if the post-selection charge/discharge efficiency is higher than the pre-selection charge/discharge efficiency.

4. The device according to claim 1, wherein the processor is configured to select the one or plurality of storage battery modules to be used, and to determine charge powers or discharge powers of the selected one or plurality of storage battery modules, based on a ratio among the charge powers or the discharge powers of the storage battery modules at maximum conversion efficiencies of the DC/DC converters.

5. The device according to claim 4, wherein the processor is further configured to calculate a maximum charge power or a maximum discharge power of each of the storage battery modules, wherein the processor is configured to select the one or plurality of storage battery modules to be used, and to determine the charge powers or the discharge powers of the selected one or plurality of storage battery modules, based further on the maximum charge powers or the maximum discharge powers of the storage battery modules.

6. The device according to claim 4, wherein the state information calculated by the processor includes at least one of a voltage, a state of charge, a temperature and an internal resistance of the battery.

7. The device according to claim 4, wherein the processor is configured to calculate the power conversion efficiency of each of the DC/DC converters based on a voltage and a current before a conversion by the DC/DC converter and a voltage and a current after the conversion by the DC/DC converter.

8. The device according to claim 4, wherein the charge power or the discharge power of each of the storage battery modules is controlled by controlling a voltage of the DC/DC converter on an opposite side of the battery.

9. A method for controlling a storage battery system, the storage battery system having a plurality of storage battery modules connected in series and each of the storage battery modules including a battery and a DC/DC converter connected to the battery;

the method comprising the steps of:

calculating state information on each of the batteries of the storage battery modules;

calculating a power conversion efficiency of each of the DC/DC converters of the storage battery modules; and selecting one or a plurality of storage battery modules to be used while the storage battery system is charged or discharged and determining a charge power or a discharge power of each of the selected one or plurality of storage battery modules, based on the state information on the batteries and the power conversion efficiencies of the DC/DC converters, wherein the selecting the one or the plurality of storage battery modules to be used while the storage battery system is charged or discharged includes stopping use of at least one of the plurality of storage battery modules.

* * * * *